United States Patent
Mauder et al.

(10) Patent No.: US 8,513,730 B2
(45) Date of Patent: Aug. 20, 2013

(54) SEMICONDUCTOR COMPONENT WITH VERTICAL STRUCTURES HAVING A HIGH ASPECT RATIO AND METHOD

(75) Inventors: Anton Mauder, Kolbermoor (DE); Helmut Strack, Munich (DE); Armin Willmeroth, Augsburg (DE); Hans-Joachim Schulze, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 1345 days.

(21) Appl. No.: 12/021,736

(22) Filed: Jan. 29, 2008

(65) Prior Publication Data
US 2008/0197441 A1  Aug. 21, 2008

(30) Foreign Application Priority Data
Jan. 29, 2007  (DE) .................. 10 2007 004 320

(51) Int. Cl.
*H01L 29/78* (2006.01)
*H01L 29/66* (2006.01)

(52) U.S. Cl.
USPC ........... 257/328; 257/341; 257/342; 257/331; 257/337; 257/E21.418

(58) Field of Classification Search
USPC ......... 257/287, 329–334, 337, 339, 340–342, 257/E21.418, 328
See application file for complete search history.

(56) References Cited

U.S. PATENT DOCUMENTS

| | | | |
|---|---|---|---|
| 4,356,211 A | 10/1982 | Riseman | |
| 4,754,310 A * | 6/1988 | Coe | 257/287 |
| 5,877,515 A | 3/1999 | Ajit | |
| 6,521,954 B1 | 2/2003 | Kouzuki et al. | |
| 6,683,347 B1 * | 1/2004 | Fujihira | 257/341 |
| 6,690,085 B2 * | 2/2004 | Nakagawa et al. | 257/656 |
| 2004/0043565 A1 * | 3/2004 | Yamaguchi et al. | 438/268 |
| 2006/0097313 A1 | 5/2006 | Yanagisawa et al. | |
| 2007/0023830 A1 * | 2/2007 | Pfirsch et al. | 257/341 |
| 2007/0228496 A1 * | 10/2007 | Rochefort et al. | 257/409 |

FOREIGN PATENT DOCUMENTS

| | | |
|---|---|---|
| DE | 102005046711 A1 | 4/2007 |
| EP | 1168455 A2 | 1/2002 |
| EP | 1267415 A2 | 12/2002 |
| WO | 0060644 | 10/2000 |
| WO | 2007012490 A2 | 2/2007 |

OTHER PUBLICATIONS

Gan et al. Poly Flanked VDMOS (PFVDMOS): A Superioir Technology for Superjunction Devices. Prociidings of IEEE 32nd Annual Power Electronics Specialists Conference, 2001, vol. 4, pp. 2156-2159.*

Office Action for German Patent Application No. 10 2007 004 320.3 dated Aug. 31, 2007.

* cited by examiner

*Primary Examiner* — Cuong Q Nguyen
*Assistant Examiner* — Galina Yushina
(74) *Attorney, Agent, or Firm* — Dicke, Billig & Czaja, PLLC

(57) ABSTRACT

A semiconductor component with vertical structures having a high aspect ratio and method. In one embodiment, a drift zone is arranged between a first and a second component zone. A drift control zone is arranged adjacent to the drift zone in a first direction. A dielectric layer is arranged between the drift zone and the drift control zone wherein the drift zone has a varying doping and/or a varying material composition at least in sections proceeding from the dielectric.

15 Claims, 13 Drawing Sheets

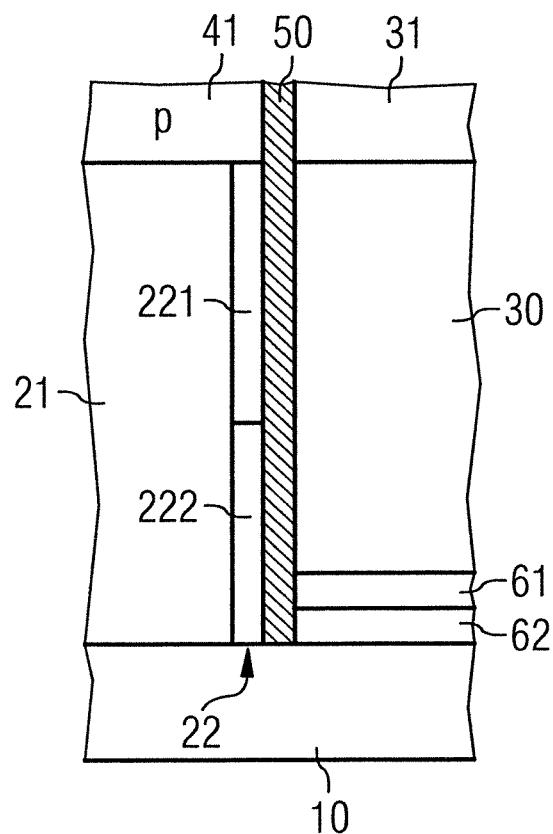

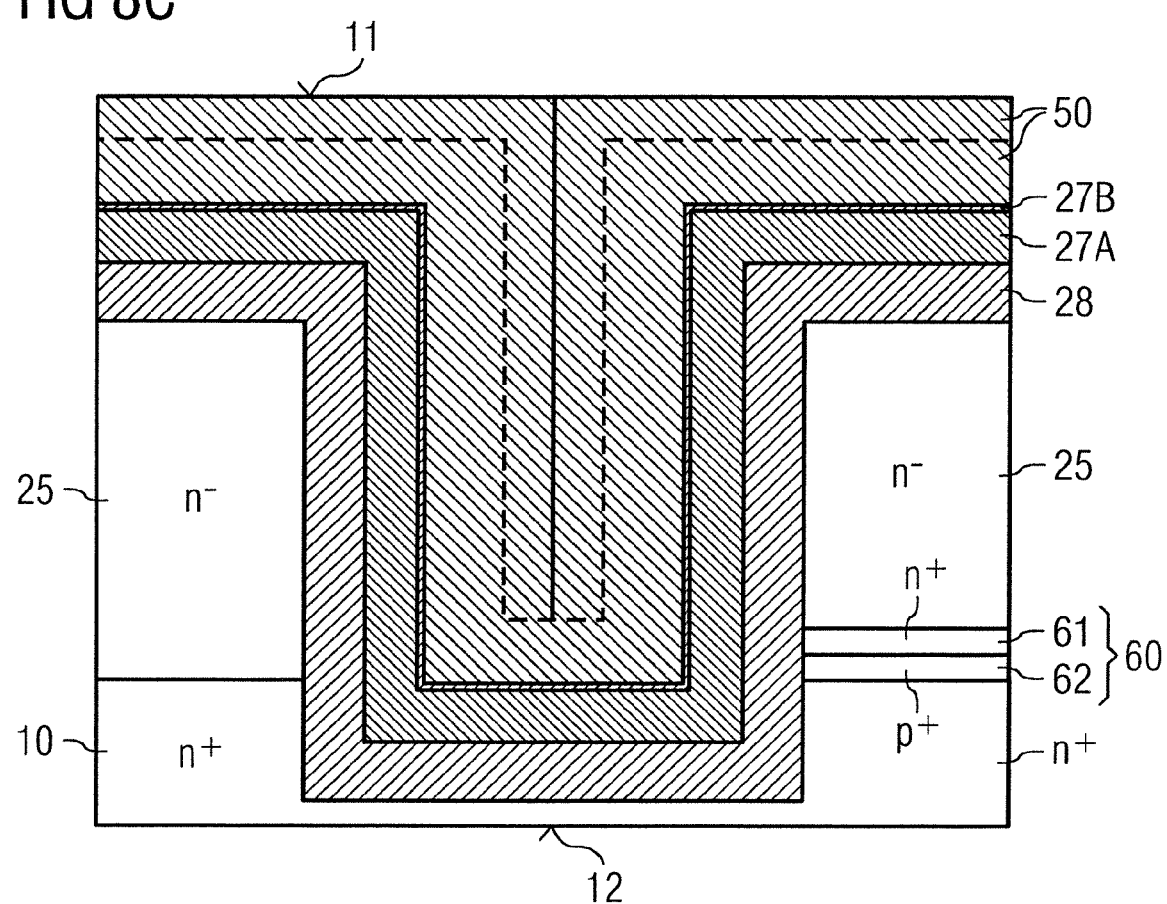

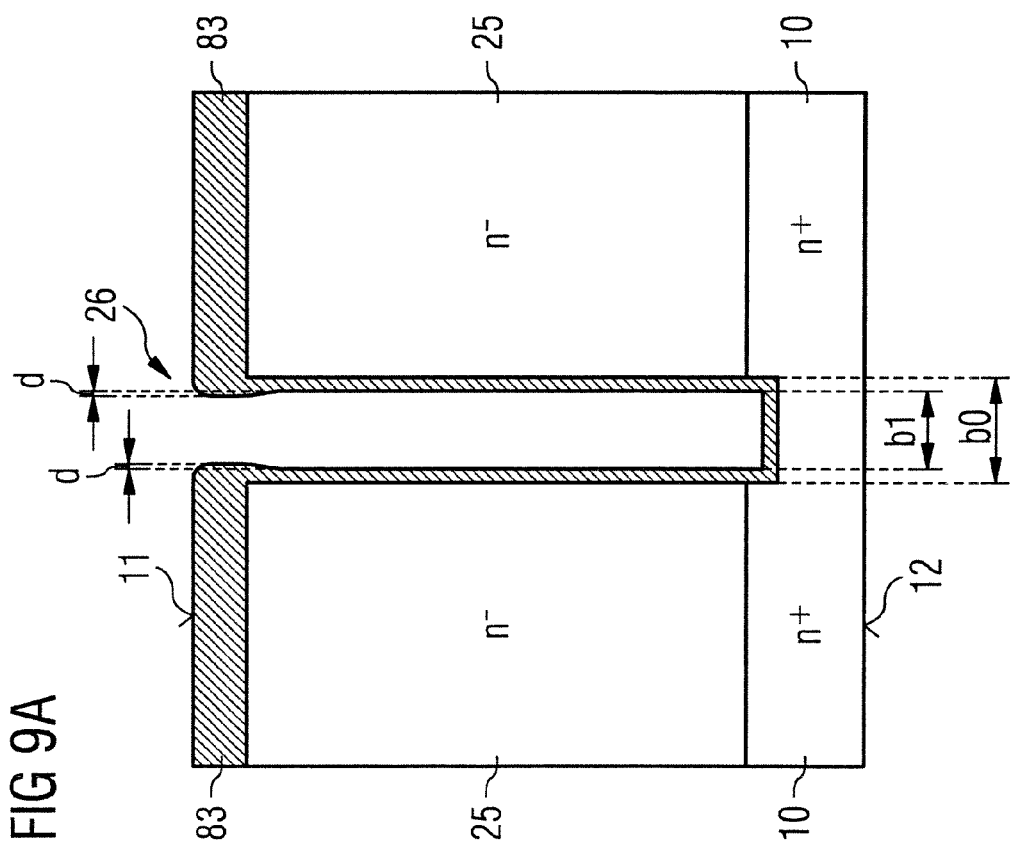
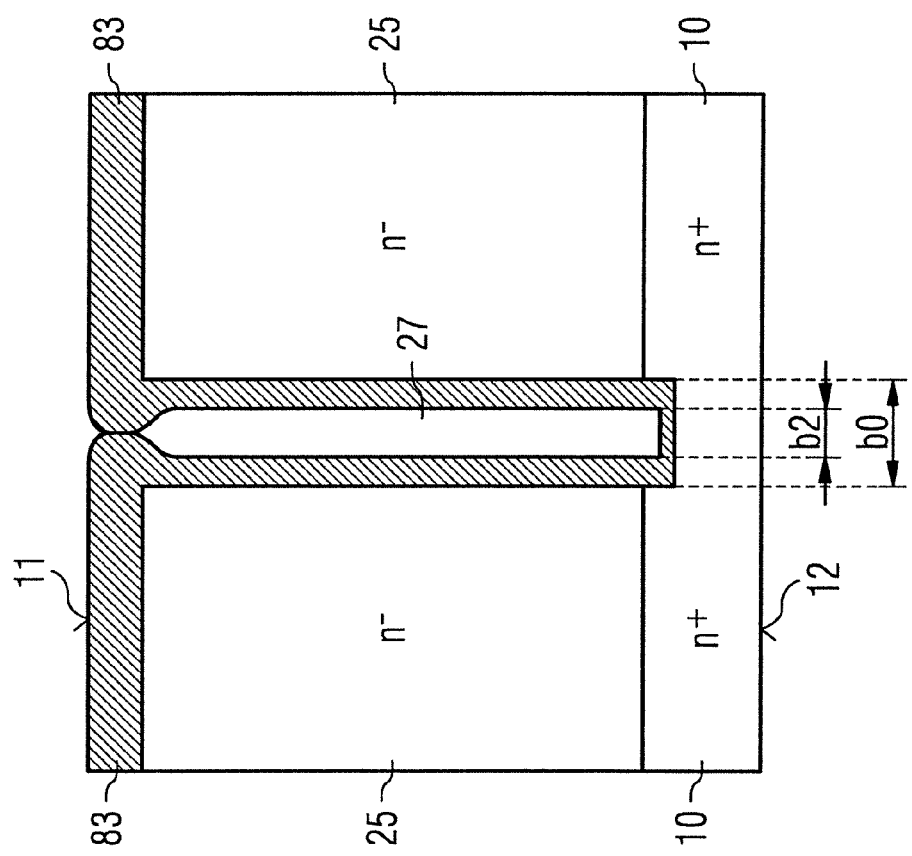

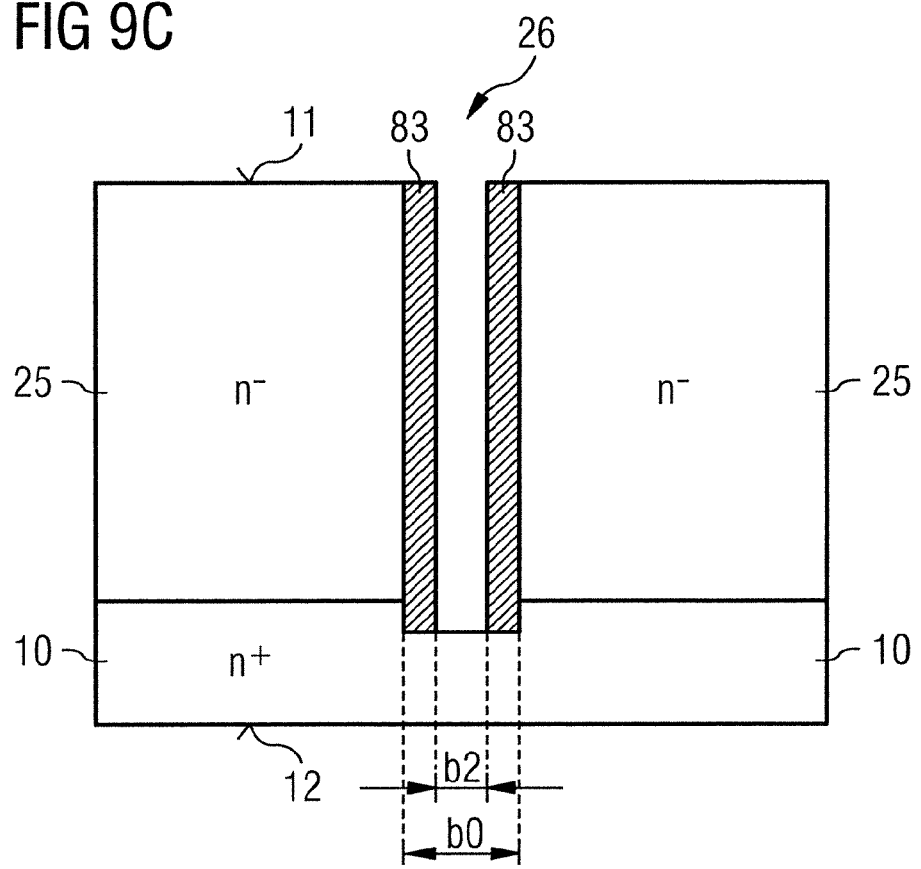

SEMICONDUCTOR COMPONENT WITH VERTICAL STRUCTURES HAVING A HIGH ASPECT RATIO AND METHOD

CROSS-REFERENCE TO RELATED APPLICATIONS

This Utility Patent Application claims priority to German Patent Application No. DE 10 2007 004 320.3 filed on Jan. 29, 2007, which is incorporated herein by reference.

BACKGROUND

The present disclosure relates to a semiconductor component with vertical structures having a high aspect ratio, and to a method for producing it.

Such component may be a MOS transistor and may include a drift control zone that is arranged adjacent to a drift zone and that is dielectrically insulated from the drift zone by a dielectric layer. In the case of the component, the drift control zone serves for controlling a conducting channel in the drift zone if the component is driven in the on state.

One problem in the operation of MOS transistors arises when avalanche breakdown occurs. The electric field strength in the component increases as the reverse voltage increases to such an extent until at a critical field strength—the breakdown field strength—free charge carriers within the free path length between two impacts with the crystal lattice take up so much energy from the electric field that, upon the next impact, they ionize the semiconductor atom hit and generate an electron-hole pair and hence further free charge carriers, which are accelerated again by the electric field. This avalanche-like multiplication of charge carriers commences particularly at inhomogeneities in the component, because spikes of the electric field strength are present there, and upwardly limits the maximum reverse voltage maintained by the component. This maximum maintained reverse voltage when avalanche multiplication is used is referred to hereinafter as blocking capability or dielectric strength of the semiconductor component. In a corresponding manner, partial regions of the semiconductor component can also have such a blocking capability.

If an avalanche multiplication of this type takes place in the vicinity of a dielectric, for example the dielectric separating the drift zone and the drift control zone or a gate dielectric that dielectrically insulates a gate electrode from a body zone, then the dielectric can be damaged by the fast charge carriers generated during the avalanche multiplication.

In the case of a component having a drift zone and a drift control zone, the problem of an avalanche breakdown occurring near the dielectric is additionally intensified by the fact that interface charges are present at the interface between the drift zone and the dielectric. The charges can bring about a curvature of the eqipotential areas in that region of the drift zone which adjoins the dielectric, such that the breakdown voltage of the semiconductor material, when the reverse voltage increases, is reached there more readily than in the sections of the drift zone which are spaced apart further from the dielectric. An avalanche breakdown thereby commences directly at the dielectric.

For these and other reasons, there is a need for the present invention.

SUMMARY

A semiconductor component in accordance with one exemplary embodiment includes a drift zone, arranged between a first and a second component zone, a drift control zone arranged adjacent to the drift zone in a first direction, a dielectric layer arranged between the drift zone and the drift control zone wherein the drift zone has a varying doping and/or a varying material composition at least in sections proceeding from the dielectric.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 4 illustrates a section of a component having a drift zone and a drift control zone.

FIGS. 8A-8C illustrate a further method for producing a capacitive structure in a semiconductor body on the basis of cross-sectional illustrations of the semiconductor body during different method process.

FIGS. 9A-9C illustrate method process for producing a semiconductor layer on sidewalls of a trench of a semiconductor body on the basis of cross-sectional illustrations of the semiconductor body during different method process.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
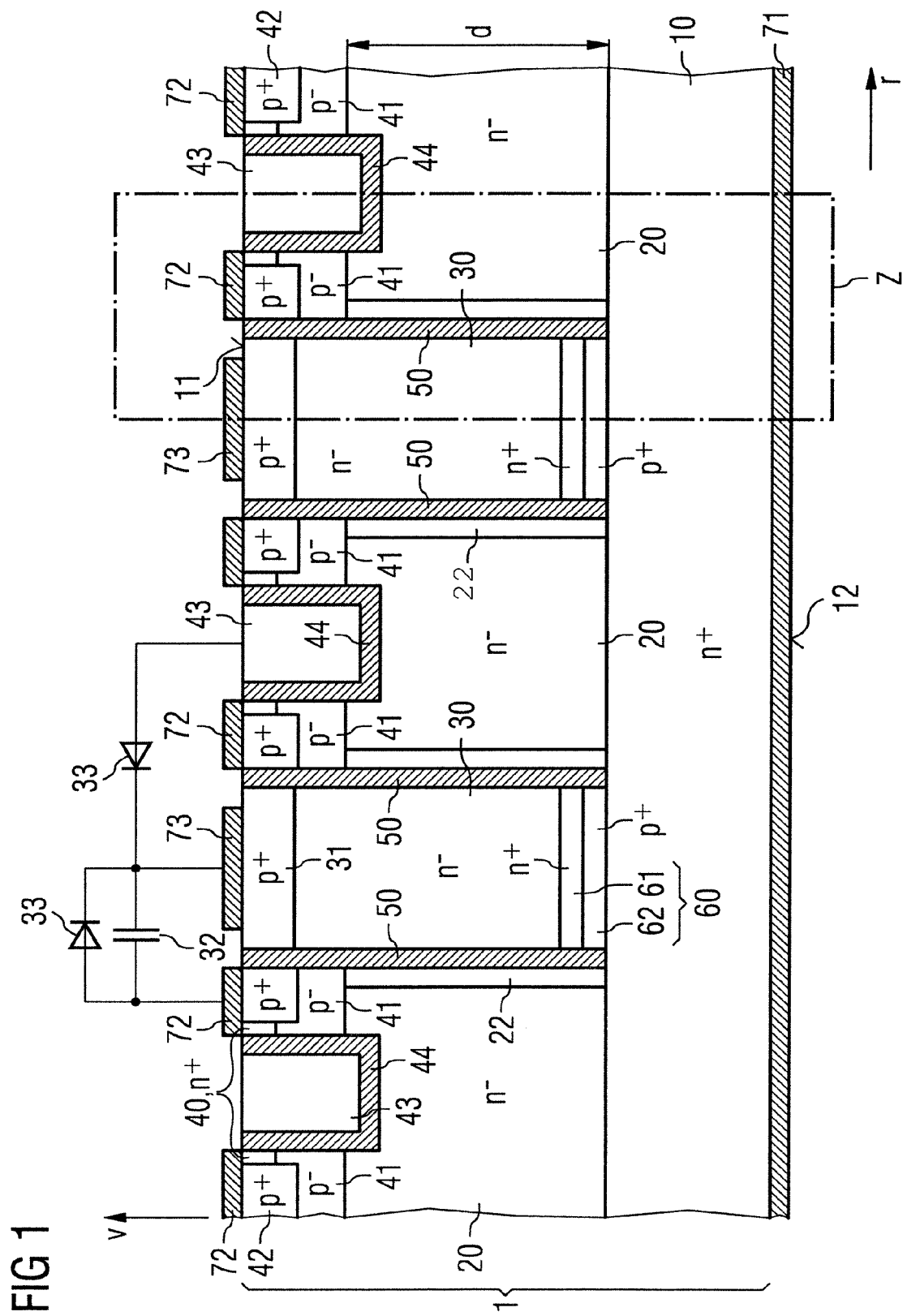
FIG. 1 illustrates a section of a component formed as a MOS transistor having a drift zone and a drift control zone, in cross section.

FIG. 1 illustrates in cross section a semiconductor body 1, in which component zones of a semiconductor component formed as a MOS transistor are integrated. The MOS transistor has a drift zone 20 and has a drift control zone 30, that is arranged in a direction transversely with respect to a current flow direction and which is dielectrically insulated from the drift zone 20 by a dielectric layer 50. The dielectric layer is referred to hereinafter as drift control zone dielectric 50.

The MOS transistor illustrated has a cellular structure and includes a multiplicity of transistor cells of identical type which are connected in parallel and which each have a drift zone 20, a source zone 40, a body zone 41, a drain zone 10, a gate electrode 43 and a gate dielectric 44. The body zones 41 are arranged between the drift zones 20 and the source zones 40 and, in the case of a normally off transistor, are doped complementarily to the source zones 40. The gate electrodes 43 are in each case arranged adjacent to the body zones 41, insulated from the body zones 41 by the gate dielectrics 44, and serve for controlling a conducting channel in the respective body zone 41 along the gate dielectric 44 between the source zone 40 and the drift zone 20. The drain zone 10 is adjacent to the drift zones 20 and is common to all the transistor cells in the example illustrated.

A source electrode 72 makes contact with the source zones 42, and additionally short-circuits the source zones 42 and the body zones 41. For connection to the body zones 41, highly doped connection zones 42 are optionally present.

The transistor illustrated is realized as a normally off n-conducting MOS transistor. In this case, the source zones 40, the drift zones 20 and the drain zone 10 are n-doped, the body zones 41 are p-doped, wherein the source zones 41 and the drain zone 10 are doped more lightly than the drift zones 20, which, with the component in the off state, serve for taking up a reverse voltage present. The indication of the doping type in FIG. 1 serves merely for affording a better understanding. It goes without saying that the component can also be realized as a p-conducting transistor. The doping types indicated in FIG. 1 should then be inverted. It goes without saying that the concept explained below can also be applied to IGBTs, in which the drain zone is doped complementarily to the drift zone.

The MOS transistor in accordance with FIG. 1 is realized as a vertical transistor. In this case, the drain zone 10, the drift zone 20, the body zone 41 and the source zone 40 are arranged adjacent to one another in a vertical direction of the semiconductor body. In this case, a current flow direction, that is to say the direction in which charge carriers flow through with the component in the on state, corresponds to the vertical direction of the semiconductor body. However, the concept of the invention explained below is not restricted to vertical components, but rather can also be applied to lateral components in a corresponding manner.

In the case of the component illustrated, drift control zones 30 are respectively arranged adjacent to the drift zones 20 in a first direction, which drift control zones are composed of a semiconductor material and are in each case insulated from the drift zones 20 by a drift control zone dielectric. In the case of the component illustrated, the first direction runs transversely with respect to the current flow direction and corresponds to the lateral direction of the semiconductor body 1.

The drift control zones 30 are electrically coupled to the drain zone 10. In the exemplary embodiment illustrated, this coupling is realized by a rectifier element in the form of a diode 60. The diode is integrated into semiconductor body 100 between the drain zone 10 and the drift zone, and has two semiconductor zones doped complementarily to one another, a first diode zone 62, which is doped complementarily to the drain zone 10 and which is adjacent to the drain zone 10, and a second diode zone 61, which is doped complementarily to the first diode zone 62 and which is adjacent to the drift control zone 30, and which are in each case doped more highly than the drift control zone 30. In a manner not illustrated more specifically, there is also the possibility of coupling the drain zone 10 to the drift control zone 30 by using a Schottky diode or a tunnel oxide. What is achieved by such coupling using a rectifier element or a tunnel oxide is that, in terms of magnitude, the electrical potential of the drift control zone 30 cannot fall below the electrical potential of the drain zone 10.

The transistor cells are realized for example as strip cells and are formed in elongated fashion in a direction perpendicular to the plane of the drawing illustrated. The transistor cells can furthermore also have polygonal transistor cells. The drift zones 20 then have a polygonal, for example a square or hexagonal, cross section in a plane running perpendicular to the plane of the drawing, and are surrounded by the drift control zone 30 in this plane. The drift control zone can optionally also include sections having a polygonal cross section which are surrounded by the drift zone.

The transistor illustrated is turned on when a suitable driving potential is applied to the gate electrode 43. In this case, an inversion channel propagates in the body zone 41 along the gate dielectric 44 between the source zone 40 and the drift zone 20. The drift control zone 30 that is at least at drain potential brings about, in the adjacent drift zone 20, an accumulation of charge carriers directly along the drift control zone dielectric 50. As a result, an accumulation channel 21 arises parallel to the dielectric 50 or along the dielectric 50. In the example illustrated, the drift control zone 30, and thus the accumulation channel, extend along the entire drift zone 20. In a manner not illustrated more specifically, there is also the possibility of realizing the drift control zone 30 in such a way that the latter extends only along a section, for example along a section adjoining the body zone 41, of the drift zone 20.

In order to bring about a good accumulation of charge carriers in the drift zone 20 for forming the accumulation channel, it is desirable to produce the dielectric 50 with a smallest possible thickness, in order that the electric field of the drift control zone 30 is not attenuated too much by the dielectric 50. The layer thickness of the dielectric 50 is ideally chosen precisely so as to ensure the required electrical insulation between the drift zone 20 and the drift control zone 30. In this case, the necessary layer thickness of the dielectric 50 is dependent on the voltage present between the drift zone 20 and the drift control zone 30 with the component in the off state. In order to keep the voltage as low as possible, and thus to be able to realize a dielectric that is as thin as possible, the drift control zone is realized in such a way that a space charge zone can propagate in the drift control zone 30 with the component in the off state. For this purpose, the drift control zone 30 is composed for example of a monocrystalline semiconductor material, the doping concentration of which can correspond to the doping concentration of the drift zone 20.

With the component in the off state, a space charge zone propagates in the drift zone 20 proceeding from the pn junction between the body zone 41 and the drift zone 20, by virtue of which space charge zone the electrical potential in the drift zone 20 increases in the case of a positive drain-source voltage in a direction of the drain zone 10. Due to the space charge zone that also propagates in the drift control zone 30 in the off-state case, the electrical potential in the drift control zone 30 along the dielectric 50 follows the electrical potential of the drift zone 20, whereby a voltage drop across the dielectric 50 is limited. The voltage profile in the drift control zone 30 is determined in particular by the doping concentration in the drift control zone 30, which can correspond to the doping concentration of the drift zone 20 and which can be in the region of approximately $10^{14}$ cm$^{-3}$ for components having reverse voltages up to approximately 600 V. For higher reverse voltages up to 2000 V, the doping concentration can be reduced by half. In order to avoid damage to the component, the doping concentration of the drift control zone 30 should be coordinated with the doping conditions in the drift zone 20, the dielectric strength of the drift control zone dielectric 50 and the desired dielectric strength of the component in such a way that, in the case of a maximum permissible reverse voltage (that is to say load path voltage when the component is driven in the off state), no avalanche breakdown occurs in the drift control zone 30 and that a space charge zone propagates in the drift control zone 30 in the current flow direction to an extent such that the electric field formed from the field strength components in the current flow direction and perpendicular to the current flow direction does not exceed the breakdown field strength of the semiconductor material used for the drift control zone 30. The doping conditions in the drift control zone 30 can be chosen in particular in such a way that the drift control zone 30 can be fully depleted in a direction perpendicular to the current flow direction or perpendicular to the drift control zone dielectric 50. In the case of the component illustrated, the current flow direction corresponds to a vertical direction of the semiconductor body 1.

The propagation of the space charge zone in the drift control zone 30 is "controlled" by the electrical potential in the drift zone 20. In this case, charge carriers previously present in the drift control zone 30 are shifted into a storage capacitance, which, in the example, is realized as an internal storage capacitance and has, at an end of the drift control zone 30 which is remote from the drain zone 10, a semiconductor zone 31 doped complementarily to the drift control zone 30, the semiconductor zone 31 being insulated from the body zone 41 and the connection zone 42 thereof by a section of the dielectric 50. In this case, the storage capacitance is formed by the body zone 41 at source potential and the connection zone 42 thereof, a section of the dielectric 50 and the semiconductor zone 31. In one embodiment, an external storage capacitance 32 can be present, which is connected between the drift control zone 30 and the source zone 40. Moreover, between the drift control zone 30 and the source zone 40 it is possible to connect a rectifier element 33, for example a diode, which essentially serves for limiting a voltage across the storage capacitance.

Furthermore, the drift control zone 30 can be connected to a charging circuit, which ensures that the drift control zone 30, with the component in the on state, has an electrical potential which is higher than the electrical potential of the drain zone 10. Such a charging circuit includes a further rectifier element 34, for example, which connects the drift control 30 to the gate electrode 43 and via which the drift control zone 30 is charged to the gate potential with the component in the on state.

It should be pointed out that the identical doping types of the drift zone 20 and the drift control zone 30 indicated in the Figure should be understood merely as an example and that there is the possibility, in particular, of doping the drift control zone 30 and the drift zone 20 complementarily to one another and of realizing the drift control zone as undoped or intrinsic semiconductor zones. The control of a conducting channel in the drift zone 20 by the drift control zone 30 even enables a doping of the drift zone 20 complementarily to the drain zone 10. A space charge zone then propagates in the drift zone 20 proceeding from the pn junction between the drain zone 10 and the drift zone 20.

The thickness of the drift control zone dielectric 50 lies between a few 10 and few 100 nm. In the case of a voltage difference of 20V between the dielectric 50 and the drift zone 20, the layer thickness, when using silicon oxide (SiO$_2$) as dielectric material, is for example between 30 nm and 200 nm.

At the same time, the dielectric 50, in comparison with its thickness, must extend very deeply into the semiconductor body 1. The required depth depends on the desired reverse voltage strength of the component and thus on the dimensions of the drift zone 20 in the vertical direction v. For a given geometry and given doping conditions, the maximum reverse voltage is determined by the electric field strength at which avalanche multiplication commences in the semiconductor material.

In the case of a component having a reverse voltage strength of 600 V, the required dimension of the drift zone 20 in the current flow direction, that is to say in the vertical direction v in the example, is approximately 55 µm.

If the dielectric extends along the entire drift zone 20 in a direction of the drain zone 10, then an aspect ratio, that is to say a ratio of width to depth, of 1:550 to 1:1830 results relative to the abovementioned exemplary values for the dielectric 50.

In the case of the component illustrated, the dopings of the drift zone 20 and of the drift control zone 30 are chosen for example in such a way that the product $N_D \cdot U_{nom}$ of basic doping $N_D$ and nominal reverse voltage $U_{nom}$ is less than $1.8 \cdot 10^{17}$ (V·atoms)/cm$^3$, and in particular lies within the range of $0.6 \cdot 10^{17}$ (V·atoms)/cm$^3$ to $1.0 \cdot 10^{17}$ (V·atoms)/cm$^3$.

With the component in the off state, that is to say—relative to the component in accordance with FIG. 1—with the inversion channel not formed and with a positive voltage between drain 10 and source/body 40, 41 a space charge zone propagates in the drift zone 20 in the manner already explained. If, as the space charge zone propagates, an electric field strength reaches the value of the critical field strength $E_{crit}$, then an avalanche breakdown occurs.

In order to avoid the occurrence of such an avalanche breakdown at the drift control zone dielectric 50, one embodiment provides for varying the doping of the drift zone 20 in the first direction proceeding from the drift control zone dielectric in such a way that the voltage loading capacity of the drift zone 20 in a section which is adjacent to the dielectric 50 and extends from the drain zone 10 as far as the body zone 41 is greater than that in a section which is arranged at a distance from the dielectric 50 and extends from the drain zone 10 as far as the body zone 41.

This makes use of the fact that the dielectric strength or voltage loading capacity of a semiconductor zone having a specific thickness which is adjacent to an abrupt pn-junction can be set by way of the doping thereof. This is explained below with reference to FIGS. 2 and 3 for an n-doped semiconductor zone composed of silicon, wherein FIG. 2 illustrates the critical field strength or breakdown field strength as a function of the doping concentration $N_D$ and FIG. 3 illustrates the dielectric strength of semiconductor zones having different thicknesses as a function of the doping concentration.

Figure 2:
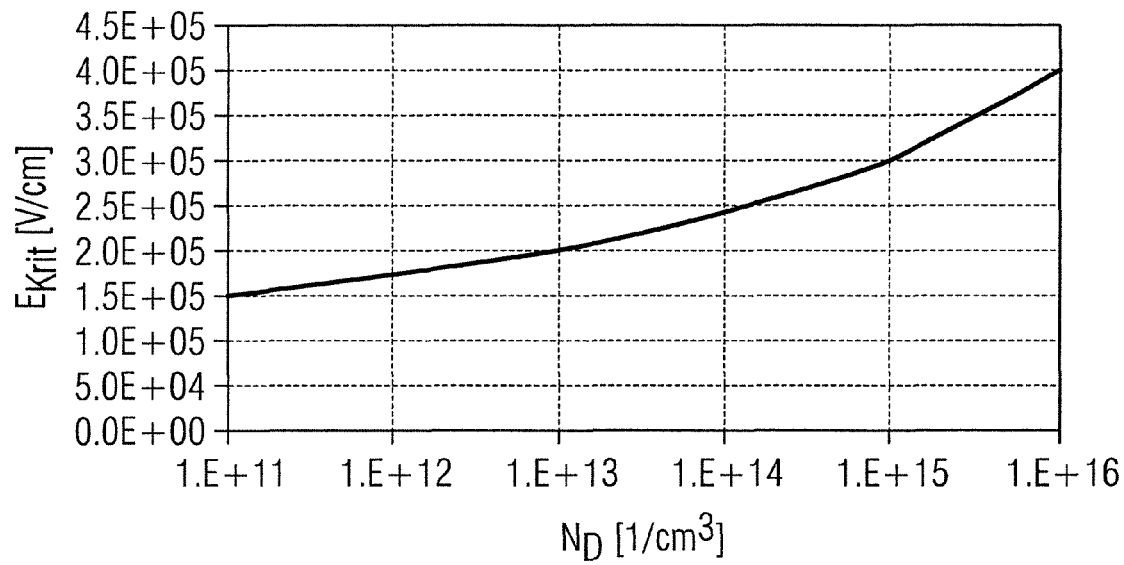
FIG. 2 illustrates the relationship between doping concentration and breakdown field strength in a semiconductor material.

Referring to FIG. 2, the breakdown field strength increases as the doping increases, or decreases as the doping decreases. For a predetermined thickness d of the semiconductor layer, the breakdown voltage as a function of the doping concentration $N_D$ has a maximum, by contrast, and decreases for doping concentrations which are greater and less than the doping concentrations determining the maximum. This becomes particularly clear in FIG. 3 on the basis of the curves for the thicker semiconductor zones where d=40 . . . 60 μm.

Figure 3:
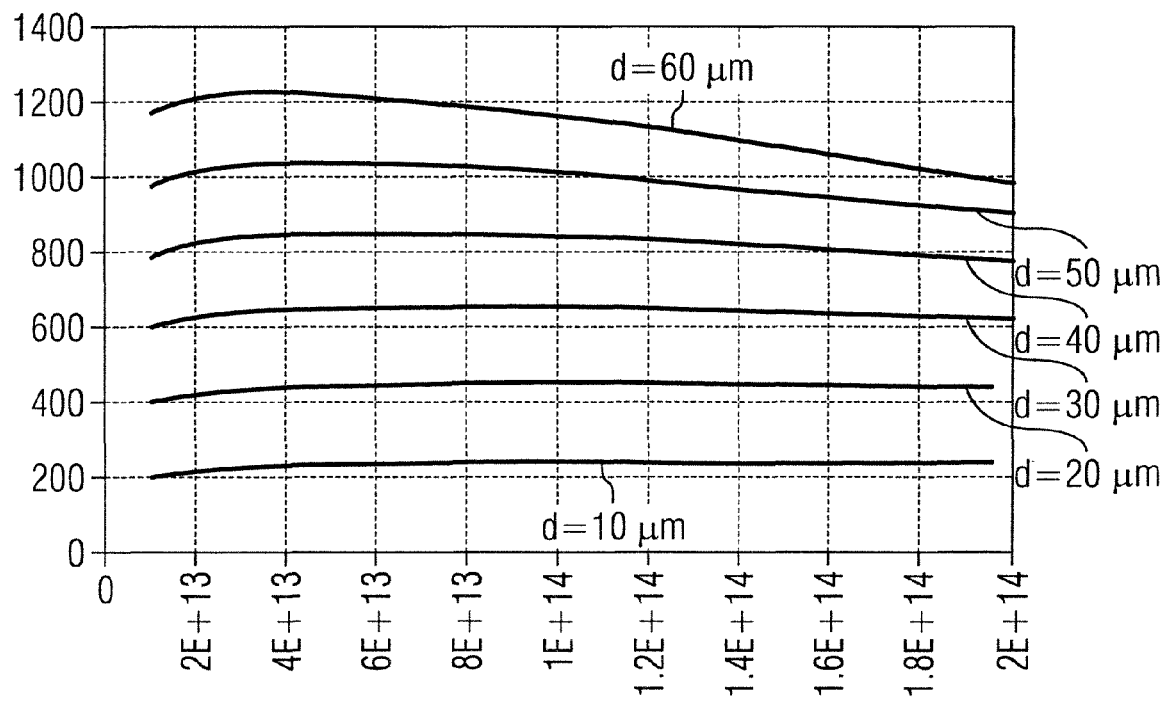
FIG. 3 illustrates the relationship between doping concentration and voltage loading capacity for semiconductor layers of different thicknesses.

The cause of this behavior stems from the mechanism for avalanche multiplication or avalanche breakdown, in which a charge carrier within its free path length between two interactions with the lattice, that is to say two lattice impacts, in the electric field takes up so much energy that the ionization energy of silicon is reached or exceeded. The charge carrier thus has enough energy to ionize a lattice atom upon the next impact with the atom. For the newly-formed electron-hole pair, the acceleration in the electric field is once again applicable, such that the avalanche-like increase in the reverse current occurs. If the doping is increased, then the probability of an interaction with the crystal lattice also increases or, in other words, the free path length between two lattice impacts decreases. Consequently, the critical field strength increases as the doping increases. On the other hand, the reverse voltage $V_{BR}$ is calculated by using the integral $$V_{BR} = \int_a^b E(x) dx,$$

where the distance b-a represents the active thickness of the component as indicated in FIG. 3. As the doping increases, the gradient of the electric field increases, such that the field strength falls to a greater extent with increasing distance from the pn junction and, consequently, the increment with respect to the integral also falls.

Proceeding from very low dopings, for a given thickness of the component, the reverse voltage thus initially increases, which is due to the increased critical field strength at which the avalanche multiplication commences. As the doping increases further, the reverse voltage then decreases again since, by the greater fall in the field strength in accordance with the higher doping, the proportion of the deeper semiconductor regions with respect to the reverse voltage decreases.

The required variation of the doping profile in the drift zone 20 for reducing the voltage loading capacity of a section of the drift zone 20 at a distance from the dielectric 50 in comparison with a section directly adjacent to the dielectric 50 can be determined as follows: taking account of the desired dielectric strength of the component, firstly the required thickness d of the drift zone 20 and the doping concentration, which is referred to hereinafter as first doping concentration, are determined. This first doping can be used as "basic doping" of the drift zone 20. Afterward, on the basis of curved profiles such as are illustrated in FIG. 3, it is determined whether the first doping concentration, as considered for rising concentrations, lies before or after the maximum of the dielectric strength. If the doping value determined lies after (before) the maximum, then a second doping concentration is defined for that section of the drift control zone which is directly adjacent to the dielectric 50, the second doping concentration being less (greater) than the first doping concentration, thereby increasing the voltage loading capacity along the dielectric relative to remaining regions of the drift zone 20.

In the case of power components having a nominal voltage of 600 V, the thickness of the drift zone 20 is in the region of approximately 55 μm and the doping concentration in the region of $10^{14}$ cm$^{-3}$. In the case of such a component, the doping concentration of the drift zone 20 is locally reduced in the region of the dielectric 50.

In order to set a locally increased voltage loading capacity at the dielectric, the drift zone can be subdivided into two or more sections or layers that are arranged adjacent in a direction of the dielectric. In this connection it should be pointed out that the section having the highest voltage loading capacity need not necessarily be arranged directly at the dielectric 50, but rather can also lie at a small distance from the dielectric.

The drift zone 20 of the component illustrated in FIG. 1 has two sections in the first direction, a first section 21, which has the first doping, and a second section, which is arranged between the first section and the dielectric. In this case, the doping concentration of the second section 22 can be homogeneous and correspond to the second doping concentration. However, the doping concentration of the second section 22 can also decrease (increase) continuously or in stepped fashion in a direction of the dielectric 50.

It should be pointed out that the voltage loading capacity of the second section 22 can increase proceeding from the first section 21 and decrease again after reaching a maximum in a direction of the dielectric 50. The section of the drift zone 20 having the highest voltage loading capacity then does not lie directly at the dielectric 50, rather there is a narrow section, for example having a width of between a few nm and a few 100 nm, between the section having the highest voltage loading capacity due to the doping and the dielectric, which narrow section can correspond to the first section 21 for example in terms of composition and doping concentration. In this case, the section having the highest voltage loading capacity nevertheless protects the dielectric 50.

In order to avoid a voltage breakdown at the dielectric 50, it suffices for the second section 22 of the drift zone to have in sections a reduced (increased) doping relative to the first section 21. Referring to FIG. 4, the doping concentration of the second section 22 of the drift zone 20 can vary in a current flow direction. Thus, the second section 22 can have a lower (higher) doping, for example in a section 221 adjacent to the body zone 41 than in a section 222 adjacent to the drain zone. The doping of this further section 22 adjacent to the drain zone can correspond for example to the doping of the first section 21 of the drift zone 20.

In order to avoid a voltage breakdown at the dielectric 50, a further embodiment provides for the material composition of the semiconductor material of the drift zone 20 to vary in the first direction. This makes use of the fact that the critical field strength or breakdown field strength of a composite semiconductor material can vary depending on the composition thereof.

One example of a semiconductor material having a breakdown field strength dependent on the composition is silicon-germanium (SiGe). In the case of SiGe, the breakdown field strength decreases as the germanium proportion increases. Therefore, one embodiment provides for realizing the drift zone from SiGe at least in sections in such a way that the Ge proportion decreases in a direction of the dielectric 50. Thus, referring to FIGS. 1 and 4, the first section 21 of the drift zone 20 can be composed for example of SiGe having a first Ge proportion and the second section can be composed of SiGe having a second, lower Ge proportion or pure silicon. In addition to a variation of the composition of the semiconductor material in the first direction, the doping of the material can vary in order to achieve a higher voltage loading capacity of the second section 22 of the drift zone 20 adjoining the dielectric 50.

The use of SiGe in the drift zone 20 along the dielectric additionally has the advantage of reducing the on resistance, since SiGe has a higher charge carrier mobility in comparison with silicon (Si).

A further variant provides for realizing the first section 21 of the drift zone 20 from Si and the second section 22 from SiGe. Since SiGe has a lower breakdown field strength than Si given identical doping, the doping concentration of SiGe should in this case be chosen to be correspondingly lower in order to avoid a voltage breakdown in the second layer. Furthermore, the Ge proportion in the SiGe section 22 can decrease in a direction of the dielectric 50 in order to achieve the zone of highest voltage loading capacity at the dielectric. A lower doping of the SiGe in comparison with the doping of the Si is noncritical with regard to the on resistance, since the latter is crucially determined by the accumulation channel and to a lesser extent by the doping of the drift zone 20.

The voltage loading capacity of the drift zone section 22 directly adjacent to the dielectric 50 can also be influenced by—apart from the doping and its material composition—(fixed) interface charges at the interface between the dielectric 50 and the drift zone 20 and by charges in the dielectric. This is explained below with reference to FIGS. 5A to 5C, which illustrate the equipotential lines (illustrated in dashed fashion) of the voltage profile for a propagating space charge zone in a homogeneously doped drift zone. For reasons of clarity, the Figures only illustrate the component zones determining the blocking behavior of the component, namely the body zone 41, the drift zone 20 and the drain zone 10. The remaining component zones such as the source zone, the gate electrode or the drift control zone with drift control zone dielectric are not illustrated or not completely illustrated.

Figure 5A:
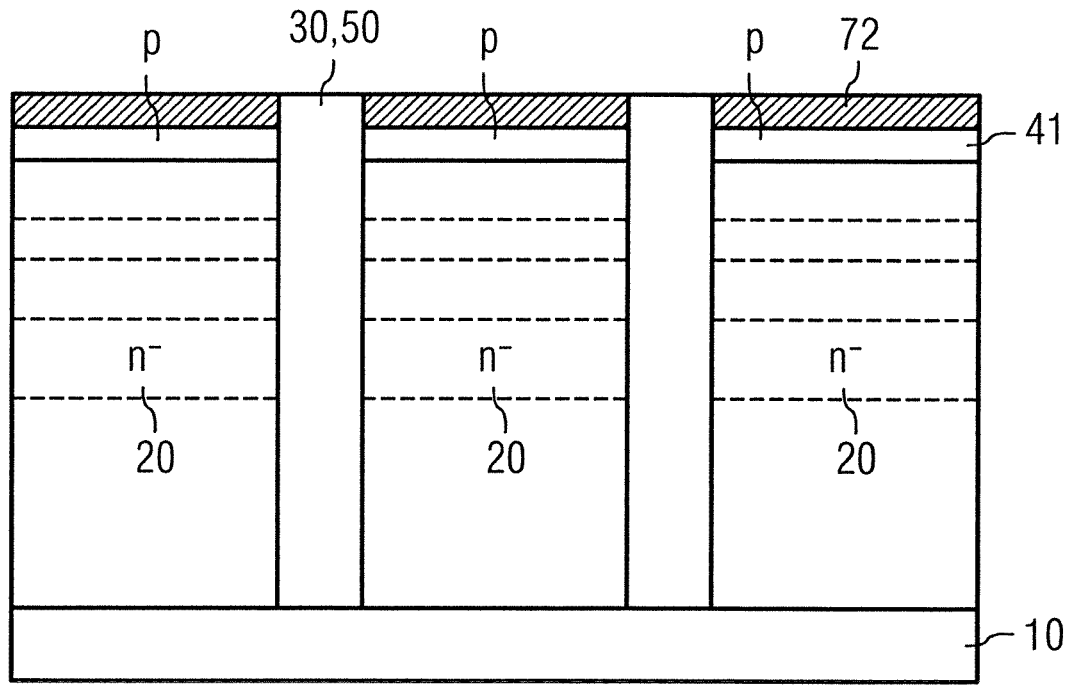
FIGS. 5A-5C illustrate the influence of interface charges present at a dielectric layer on the potential distribution of a semiconductor layer that is arranged adjacent to the dielectric, in the case of a propagating space charge zone.

FIG. 5A illustrates the equipotential profiles for the case of a neutral interface, that is to say an interface having no charges. The potential distribution in the drift zone 20 is thereby homogeneous within individual planes each running perpendicular to the current flow direction.

Figure 5B:
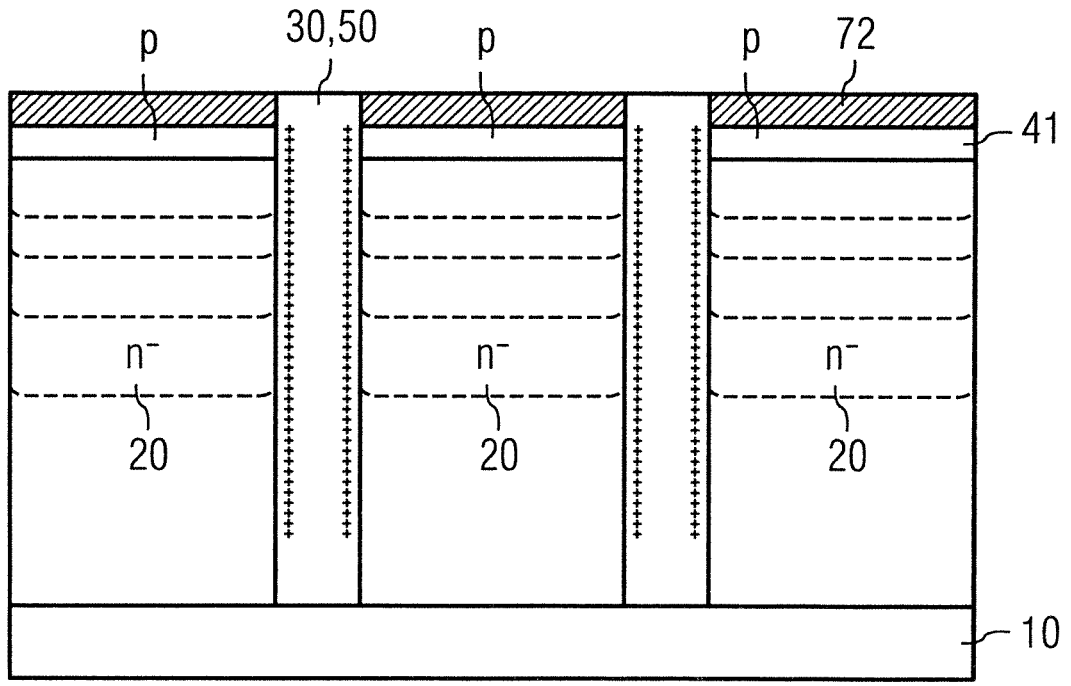
Figure 5C:
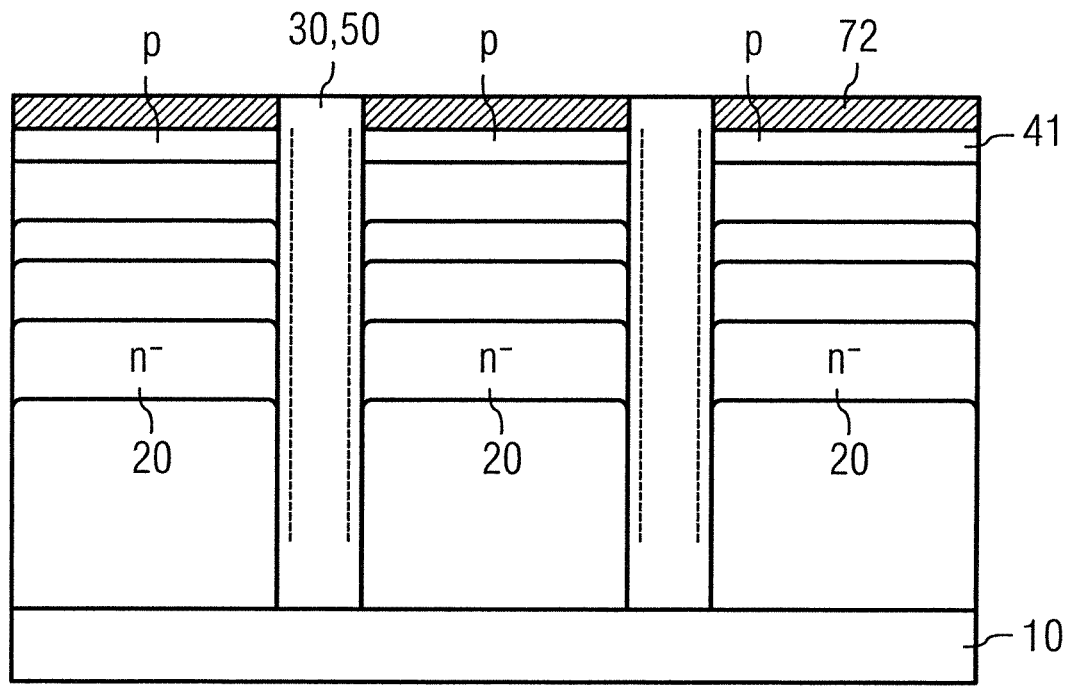

FIGS. 5B and 5C illustrate the potential profiles for the case of a positive drain-source voltage and positive and negative interface charges, respectively. These interface charges lead to an inhomogeneous potential distribution within individual planes running perpendicular to the current flow direction and parallel to the pn junction, or to curved profiles of the equipotential lines in the region of the dielectric 50. In the region of the curvatures of the equipotential lines there is a higher field strength loading and, as a result, a higher risk of a voltage breakdown unless further measures are implemented.

Such a curvature can be avoided by a suitable choice of the doping conditions, as explained below. For explanation purposes it shall initially be assumed in this respect that the drift zone 20 can be subdivided into a multiplicity of planes, or infinitesimally thin slices, running perpendicular to the current flow direction. Hereinafter Q21 shall denote the dopant charge of the first section within such a plane, Q22 shall denote the dopant charge of the second section 22, and Q20, 50 shall denote the interface charge lying within the plane.

A curvature of the equipotential lines can be prevented if the dopings of the first and second sections are chosen—under the secondary condition of a higher voltage loading capacity of the second section 22—in such a way that the following holds true:

$$Q21 - Q22 \approx Q20,50 \tag{1}$$

The difference between the charge Q21 in the first section and the charge in the second section should at least approximately correspond to the interface charge. In this case, the respective charges should be considered correctly in terms of sign, of course. Positive interface charges thus require a positive difference and vice versa. In order to compensate for the interface charges, there is the possibility, in particular, of doping the first and second sections 21 and 22 of the drift zone 20 complementarily to one another. If, in the case of an n-conducting component, the second section 22 of the drift zone 20 is p-doped, then the drift control zone 30 controls an inversion channel instead of an accumulation channel along the drift control zone dielectric 50 and it is possible to compensate for charges Q20,50 which are greater than the charge Q21.

In this case, the following relationship is complied with in order to avoid an avalanche breakdown in the drift zone in a direction perpendicular to the current flow direction:

$$\left| \frac{(Q21 + Q22 + Q20,50) \cdot H_{DZ}}{B_{DZ}} \right| \leq Q_{BR} \tag{2}$$

where $B_{DZ}$ indicates the width of the drift zone in a radial direction r, $H_{DZ}$ indicates the height of the drift zone in a vertical direction v, and $Q_{BR}$ indicates the "breakdown charge", which is approximately $2 \cdot 10^{12}$ dopant atoms/cm². It should be taken into consideration that in (1) the charge of the dopant atoms in the space charge zone must likewise be taken into account correctly in terms of sign, that is to say the positive space charge of donors and the negative space charge of acceptors.

In the case of a cellularly constructed component in accordance with FIG. 1, only in each case that proportion of the drift zone which belongs to a half-cell is to be taken into consideration for the determination of the relationships (1) and (2). In the case of the component in accordance with FIG. 1 a half-cell includes only half the drift zone in a lateral direction, such that integration is to be correspondingly effected only over half the width of the drift zone 20. The dimensions of such a half-cell are depicted in dash-dotted fashion in FIG. 1 and designated by Z.

It should be pointed out that the invention is not restricted to MOS transistors, but rather can be applied to any components having a drift zone and a drift control zone, in particular also to bipolar diodes and Schottky diodes. A bipolar diode is obtained, for example, if the source zone and the gate electrode are dispensed with in the case of the MOS transistor in accordance with FIG. 1, which behaves like a diode in the off-state case. A Schottky diode is obtained, for example, if in the case of the component in accordance with FIG. 1, the source zone, the body zone and the gate electrode are dispensed with and a suitable material that forms a Schottky junction is chosen for the electrode that then makes contact with the drift zone.

For realizing the components explained above it is necessary to produce a capacitive structure in a semiconductor body, which structure has a dielectric arranged in a trench with a high aspect ratio. A method for producing such a capacitive structure is explained below with reference to FIGS. 6A to 6E. The Figures illustrate a semiconductor body 1 in cross section during different phases of the production of the capacitive structure.

The method is explained below on the basis of a method for producing a capacitive structure for the component illustrated in FIG. 1, but is not restricted thereto. Referring to FIG. 1, the method begins by providing a semiconductor body 1, which can include two semiconductor layers, a first semiconductor layer 10 and a second semiconductor layer 25 applied to the first semiconductor layer 10. The first semiconductor layer 10 is for example a semiconductor substrate, and the second semiconductor layer is for example an epitaxial layer applied to the substrate 10.

In the semiconductor body 1, a diode structure having semiconductor zones 61, 62 (illustrated in dashed fashion) doped complementarily to one another can be arranged between the first and second semiconductor layers 10, 25.

Figure 7A:
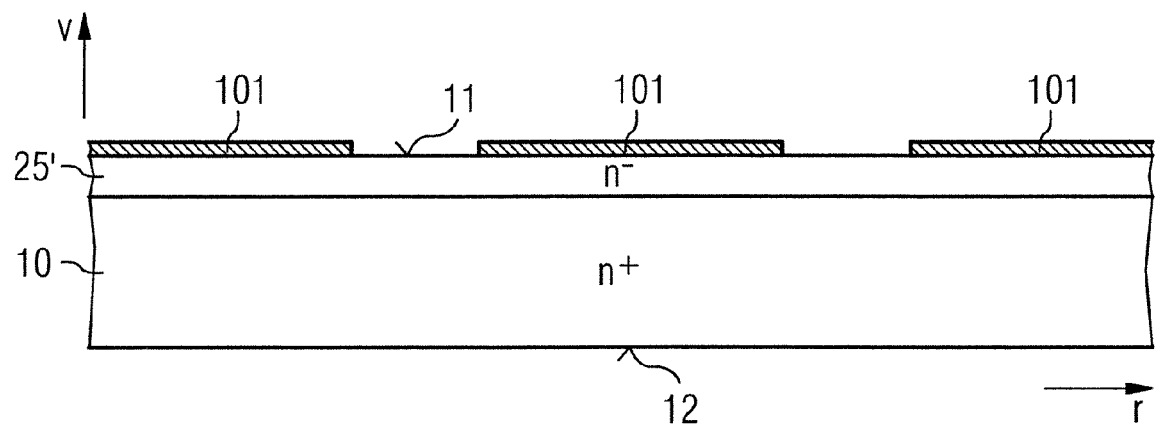
FIGS. 7A-B illustrates a method for producing a bipolar diode structure in a semiconductor body.
Figure 7B:
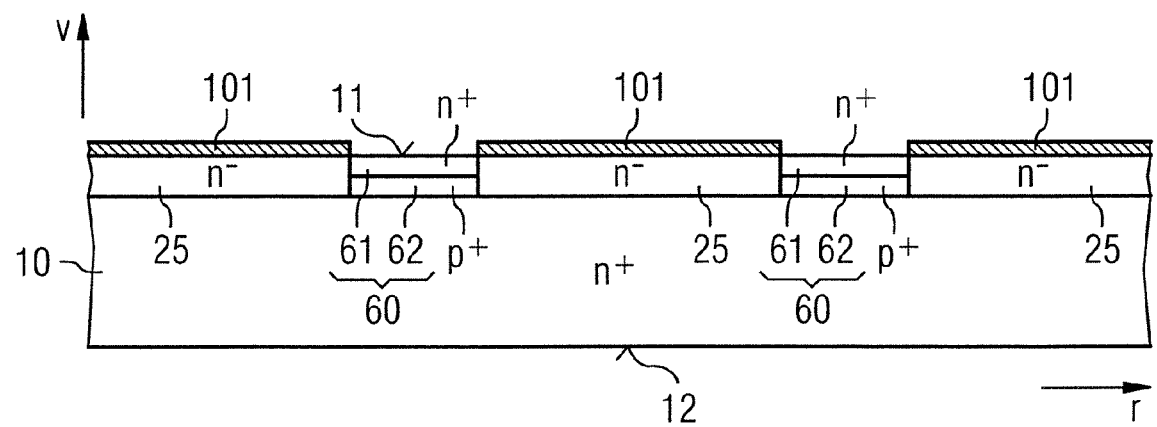

The integration of such a diode structure is effected, referring to FIGS. 7A and 7B, for example by implementation of dopant atoms into an initially deposited partial layer 25' of the epitaxial layer using a patterned mask. In this case, dopants that are complementary to one another are implanted into different depths. FIG. 7A illustrates the component structure after applying the mask, and FIG. 7B illustrates the structure after carrying out the implantation.

Figure 6A:
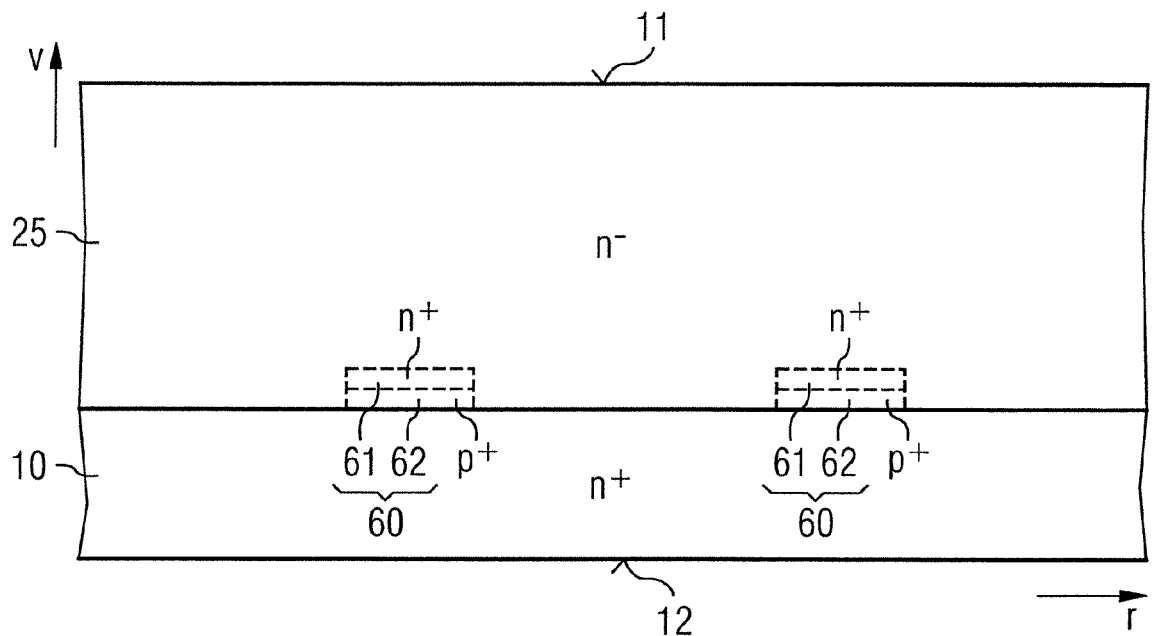
FIGS. 6A-6E illustrate a method for producing a capacitive structure in a semiconductor body on the basis of cross-sectional illustrations of the semiconductor body during different method process.

After the removal of the mask 101, the epitaxial layer 25 is constructed further, the result of which is illustrated in FIG. 6A.

Figure 6B:
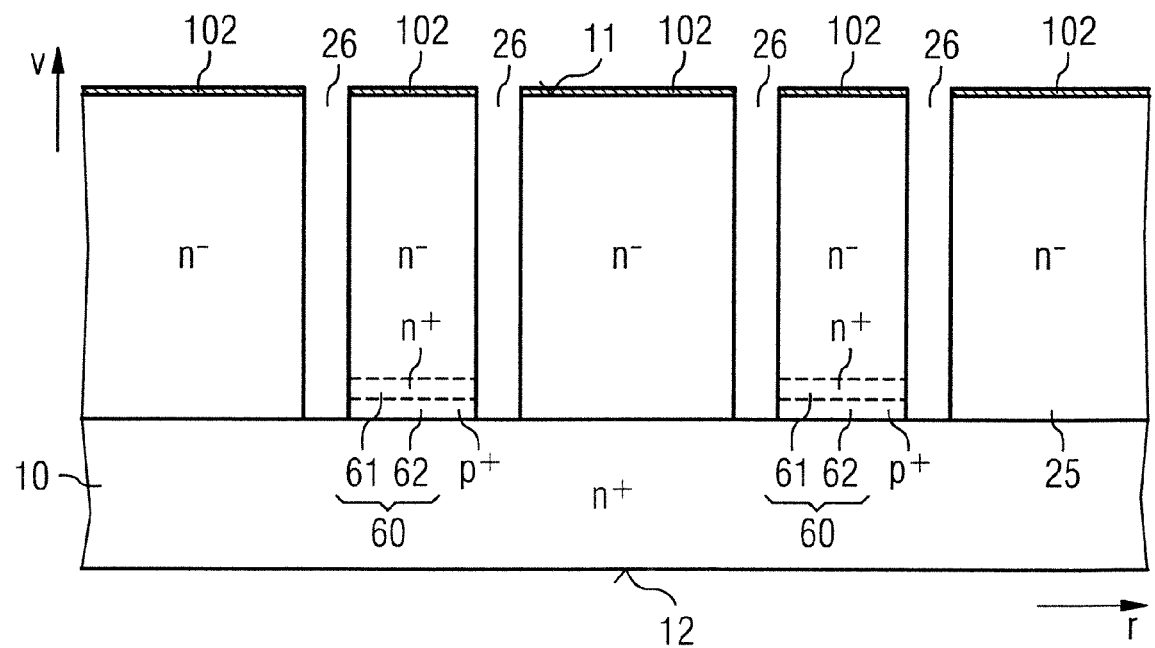

Referring to FIG. 6B, trenches 26 are then produced which extend into the semiconductor body 1 in a vertical direction proceeding from a first side, which is referred to hereinafter as front side. The trenches can be produced for example by using an anisotropic etching process using a patterned mask 102 applied to the front side 11 of the epitaxial layer 25.

In this case, the width of a trench 26 can be chosen to be greater than the width of the dielectric that is subsequently to be produced in the trench 26. Wider trenches can be realized more easily in terms of fabrication technology. Typical aspect ratios of trenches produced by an etching method lie within the range of between 10 and 40 and also depend on the absolute trench depth to be obtained. In order to produce a 50 µm deep trench 26, for example, the trench must be made approximately 1.25 µm to 5 µm wide. By contrast, the desired thickness of the dielectric lies for example between 30 nm and 200 nm, in particular between 50 nm and 140 nm.

The trenches 26 can extend in the vertical direction v as far as the heavily doped semiconductor layer that can form the later drain zone 10, or even into the semiconductor layer 10. In principle, however, the bottoms of the trenches 26 can also be spaced apart from the later drain zone 10.

The trenches 26 can be produced in particular in such a way that the diodes 60 extend in the lateral direction as far the sidewalls of the trenches 26.

After the trenches 26 have been etched, the trenches 26, in particular the sidewalls thereof, can optionally be cleaned and smoothed by using a high-temperature hydrogen heat treatment, which provides for a monocrystalline application of further epitaxial layers.

Figure 6C:
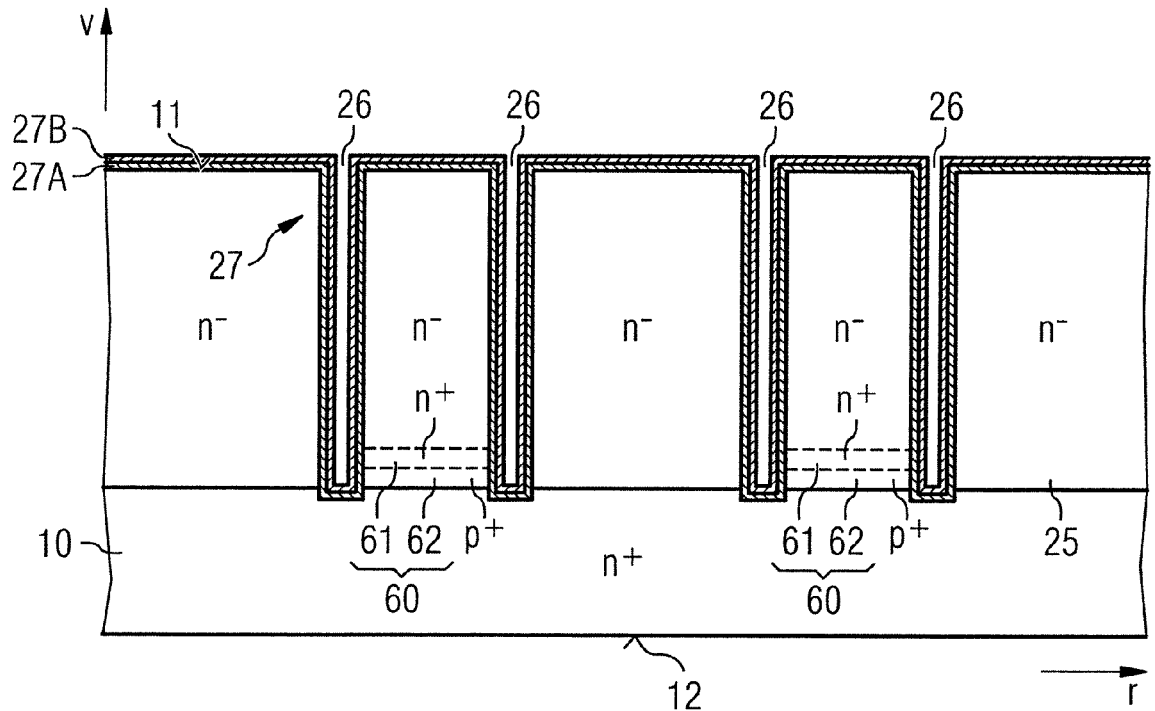

Afterward, at least one semiconductor layer is deposited onto sidewalls and bottom of the trenches 26, whereby the trenches 26 are partly filled whilst retaining a smaller "residual" trench, the result of which is illustrated in FIG. 6c. The at least one semiconductor layer is produced for example by an epitaxial deposition in order to deposit the semiconductor layer as far as possible conformally and as far as possible in monocrystalline fashion.

Figure 6D:
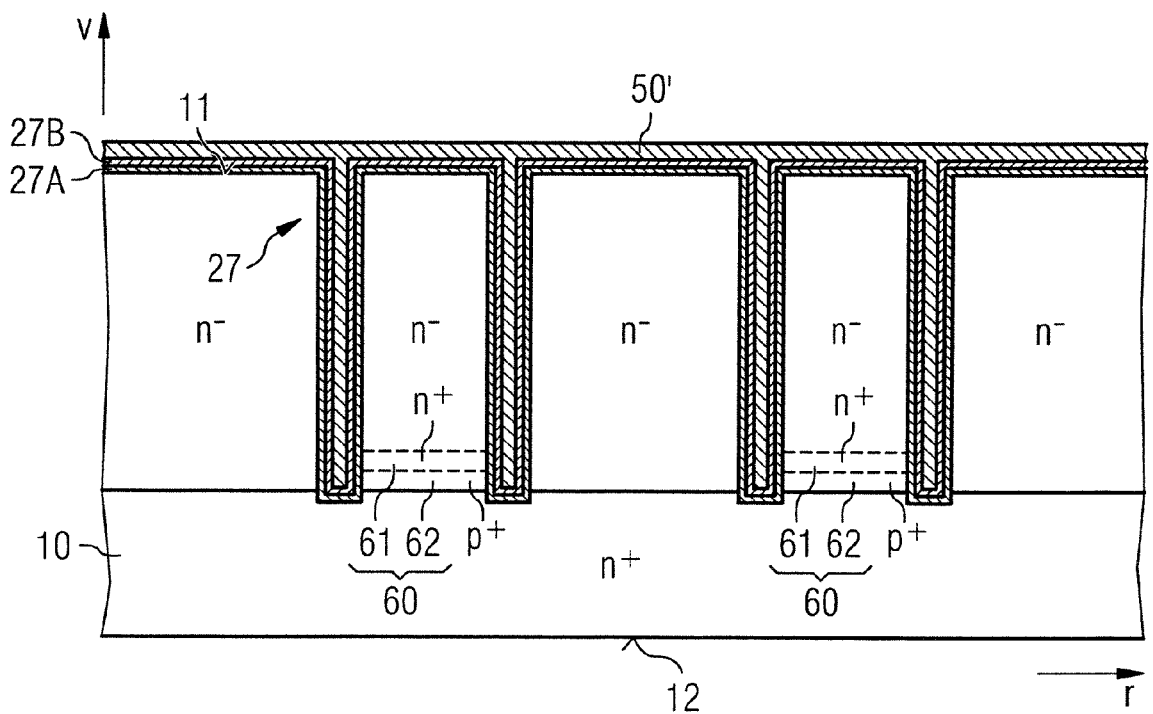
Figure 6E:
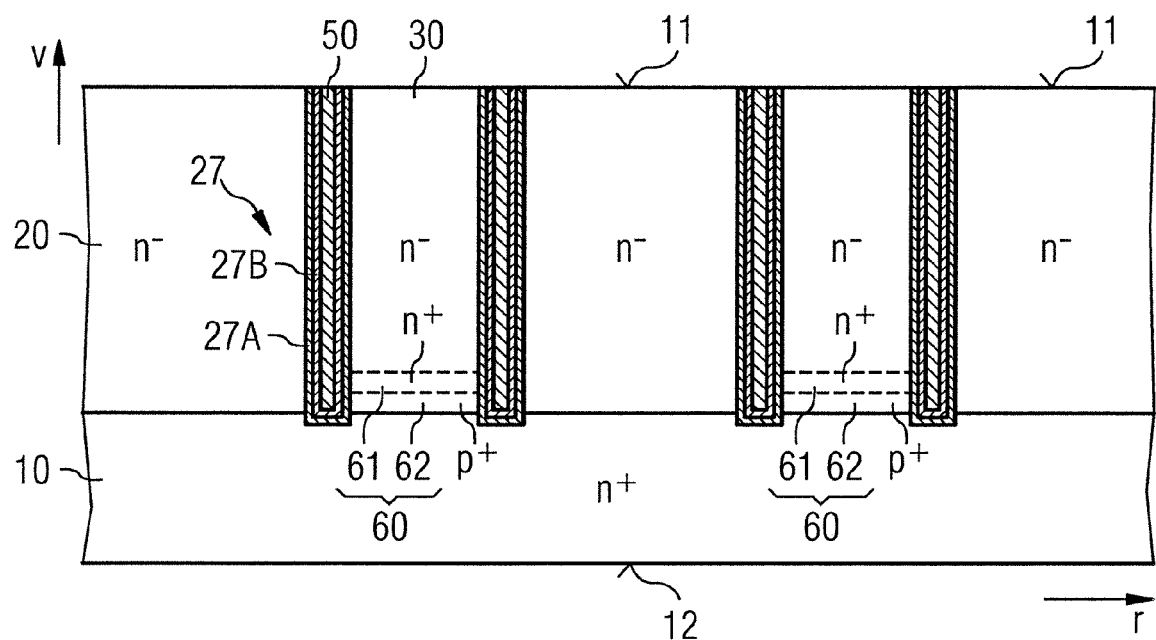

The "residual" trenches are subsequently filled by using a dielectric 50, the result of which is illustrated in FIG. 6D. For this purpose, by way of example, a dielectric layer 50' is deposited over the whole area, which dielectric layer is subsequently removed from regions above the front side 11 by using a planarization process, the result of which is illustrated in FIG. 6E. In this case, the dielectric can include an insulation material or in one embodiment a layer sequence of different insulation materials.

In order to produce a component in accordance with FIG. 1, the explained method processes for producing the capacitive structure can be followed by method processes for producing the source zone 40, the body zone 41 and the gate electrode 43 with gate dielectric 44.

The method explained, which involves firstly producing trenches 26 having a width that is significantly greater than the width of the thin vertical dielectric layers 50 to be produced, makes it possible, in a simple and effective manner to produce such thin dielectric layers 50 with a high aspect ratio. That section of the semiconductor layer 27 which is deposited in each case on a sidewall of the trenches 26 forms, in the later component, a section of the drift zone (20 in FIG. 1) that is adjacent to the dielectric 50. In this method, the doping concentration and the material composition of that section of the drift zone 20 which is adjacent to the dielectric 50 can be set in a simple manner by using the deposition conditions of the semiconductor layer. In this case, the doping concentration and/or material composition are set in particular in such a way that they meet the requirements explained above with regard to a higher voltage loading capacity of the drift zone 20 adjacent to the dielectric.

Referring to FIG. 6C, in the method it is possible to produce in particular two or more semiconductor layers 27A, 27B in the trenches 26 before producing the dielectric layer 50. These semiconductor layers 27A, 27B can together form the second section 22 of the drift zone 20. Furthermore, it is also possible for a layer 27A deposited first to serve merely as a filling layer which has the same properties as the epitaxial layer 25 and which later forms part of the first section of the drift zone 20, while only the second semiconductor layer 27B deposited afterward forms the second section of the drift zone 22.

The method explained leads to a symmetrical structure with respect to the dielectric layer, which means that in the finished component having a capacitive structure produced by using the method, apart from the drift zone 20, the drift control zone 30 also has a doping or material composition that varies in a direction of the dielectric. However this does not change anything in respect of the fundamental electrical properties of the component. The semiconductor layer(s) 27, (27A, 27B) can be produced using process gases such as e.g., dichlorosilane or trichlorosilane, but preferably trisilane ($Si_3H_8$), and also by using suitable deposition conditions. A good quality of the epitaxial layers 27A, 27B can be achieved primarily by depositing them at comparatively low temperatures within the range of 400° C. to 600° C.

By setting the thickness of the semiconductor layer deposited last, here the semiconductor layer 27B, it is possible to set the width of a remaining residual trench 26. This width is orientated to the required width of the dielectric to be produced.

The dielectric 50 which wholly or partly fills the residual trenches after the production of the semiconductor layer 27 is an oxide, for example. This dielectric can be produced e.g., by depositing the dielectric by using a CVD process (CVD=Chemical Vapor Deposition).

Another possibility for producing the dielectric 50 consists in thermally oxidizing the semiconductor material situated at the surface of the residual trench 26 until a semiconductor oxide layer having a desired thickness is present on the trench sidewalls. Given a suitably chosen width of the residual trench 26 or given suitable flank angles, that is to say inclination of the trench sidewalls, the trench can even be closed off by a thermal oxidation and thus be completely filled with oxide.

As an alternative to the arrangement illustrated in FIG. 6E, the semiconductor layers 27A, 27B can also be produced in such a way that one or both of the layers is or are partly etched back after deposition, thereby ending below the front side 11 in the trench.

Proceeding from the arrangement in accordance with FIG. 6E and the alternative embodiments mentioned, the source zones 40, body zones 41, gate electrodes 43 and gate electrics 44 illustrated in FIG. 2 can be produced in a manner known per se. In the context of a heat treatment process required for this purpose or else by using a separate heat treatment process, the diode zones 61, 62 of the diodes 60 are in particular also outdiffused in the lateral direction r to an extent such that they locally interrupt the semiconductor layers 81, 82 and extend as far as the dielectric 50, such that—as can be seen in FIG. 2—the drift control zones 20 to be produced are coupled to the drain zones 10 only via the diodes 60.

A further method for producing a capacitive structure in a semiconductor body is explained below with reference to FIGS. 8A to 8C.

Figure 8A:
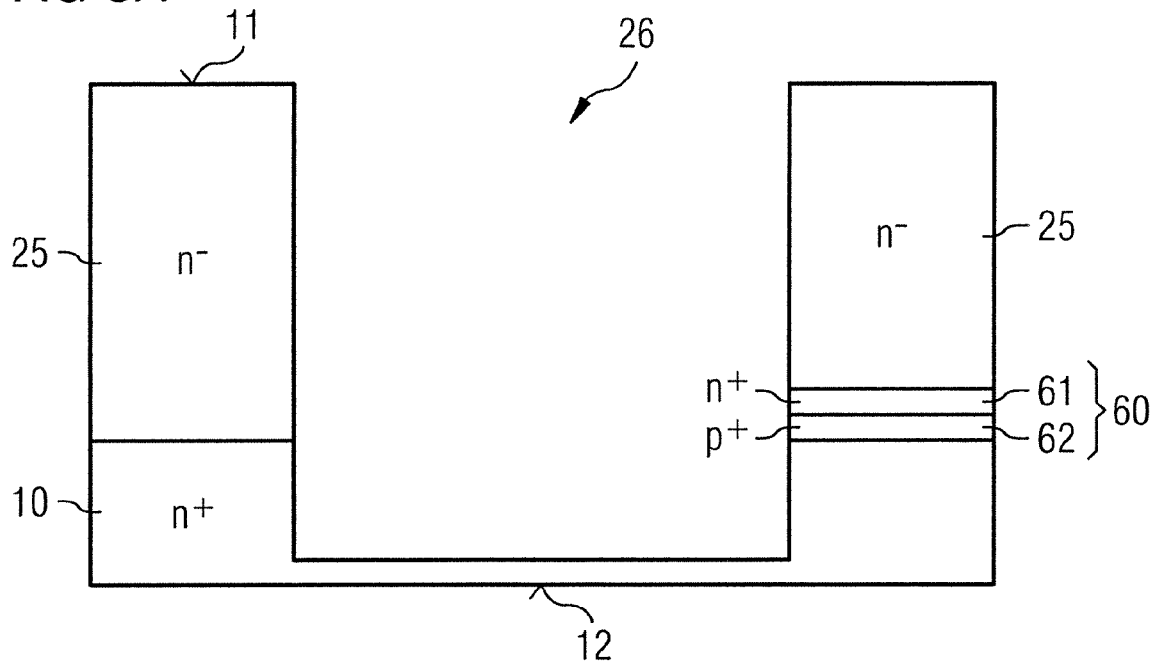

FIG. 8A illustrates in cross section a semiconductor body 1 with a trench 26 already produced, the width of the trench being significantly greater than the thickness of a dielectric layer to be produced. Such a wide trench 26 can be produced more simply in terms of etching technology on a narrow trench having the same depth.

Figure 8B:
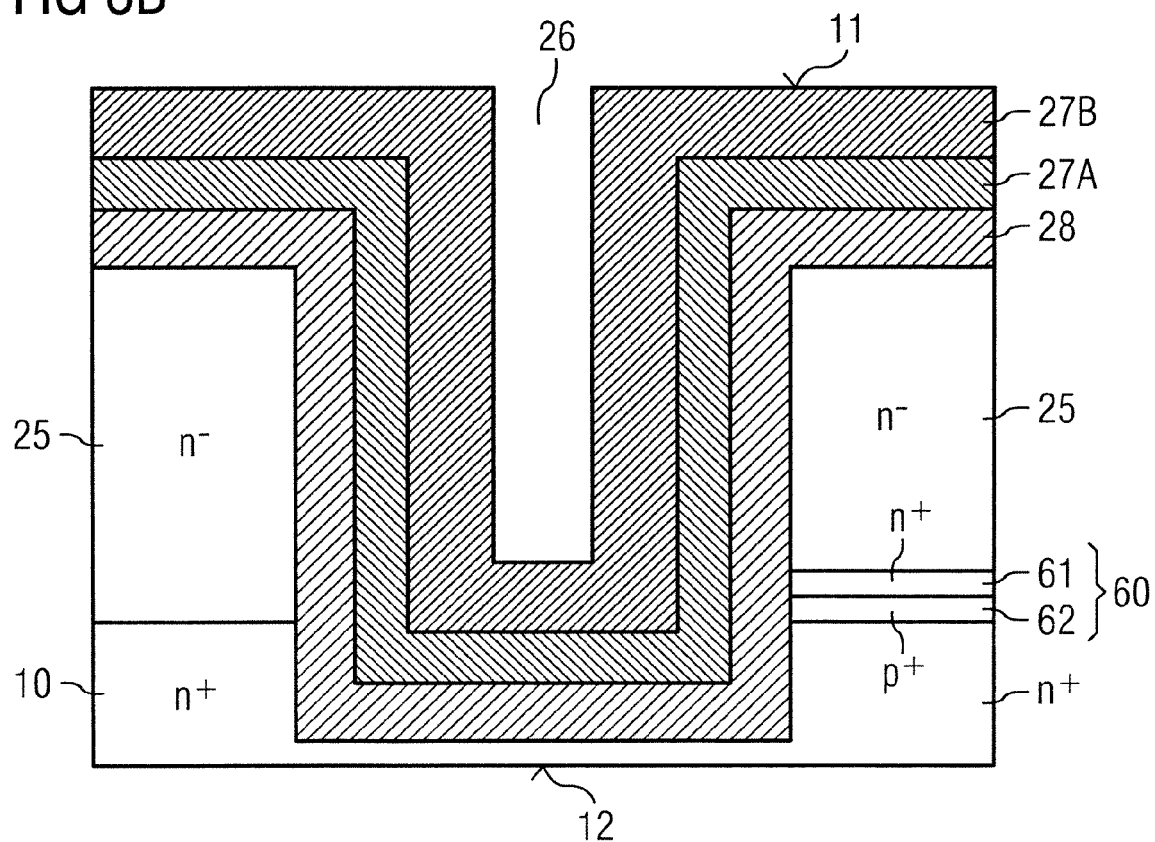

At least three semiconductor layers 28, 27A 27B are subsequently deposited onto the semiconductor arrangement with the trench, the result of which is illustrated in FIG. 8B. Optionally, the trench surfaces can be conditioned by using a high-temperature hydrogen heat treatment or the production and subsequent etching of a thermal oxide before the deposition of the semiconductor layers 28, 27A, 27B. A layer 28 deposited first serves as a filling layer in this case and may correspond to the epitaxial layer 25 with regard to the material used and the doping concentration. The semiconductor layer 28 then forms a part of the first section 21 in the region of the later drift zone (20 in FIG. 1). The two semiconductor layers 27A, 27B deposited afterward may correspond to the semiconductor layers 27A, 27B in accordance with FIG. 6C with regard to their function, their material and their doping concentration. At least one of these two semiconductor layers, namely the one deposited last, forms the second section of the drift zone 20 in this case.

Depending on the component to be fabricated, the trench 26 is intended to have a specific target width before the production of the dielectric layer arranged at least partly therein. The target width can be established by choosing the thicknesses of the semiconductor layers 28, 27A, 27B in a suitable manner. The trench is adapted to the target width in particular by using the filling layer 28 if the other two layers 27A, 27B form the second section 22 of the latter drift zone, which second section is intended to have a higher dielectric strength than the first section by using a suitable doping that can be set during the deposition of the layers 27A, 27B or by using suitable choice of material.

Thus, the semiconductor layer 27B deposited last is composed for example of pure silicon or of $Si_xGe_{1-x}$, where x>0.7. The semiconductor layer 27A deposited directly beforehand is composed for example of $Si_yGe_{1-y}$, where y>0.7 and y<x, that is to say has a higher proportion of Ge and thereby has a lower dielectric strength. The semiconductor layer 28 deposited first is composed for example of pure silicon or SiGe and can have the same composition as the penultimate deposited layer 27A.

The layer 27B deposited last may also be composed of $Si_xGe_{1-x}$, where x>0.7, and the semiconductor layer 27A deposited directly beforehand may be composed of $Si_yGe_{1-y}$, y>0.7 and y>x. The layer 27A then has a lower proportion of Ge and—given the same doping—thus a higher voltage loading capacity than the layer 27B. The region of the later drift zone 20 with the highest voltage loading capacity is then spaced apart from the dielectric 50 at a distance of, for example, a few 10 nm to a few 100 nm. In this case, the layer 28 deposited first may correspond to the layer deposited last in terms of composition and doping concentration.

After the deposition of the semiconductor layers 28, 27A, 27B, a thermal oxidation process is effected, the result of which is illustrated in FIG. 8C. At least the semiconductor material of the semiconductor layer 27B deposited last is at least partly thermally oxidized as a result of this.

The semiconductor oxide that forms requires more volume than the oxidized semiconductor material, such that the width of the residual trench 26 (FIG. 8B) present before the thermal oxidation is reduced. In this case, the width of the residual trench 26 and the duration of the oxidation process can be coordinated with one another in such a way that the residual trench 26 is completely closed by the thermal oxidation, the result of which is illustrated in FIG. 8C. For comparison, the original course of the residual trench 26 in accordance with FIG. 12 is illustrated in dashed fashion. The dielectric 50 arising as a result of the thermal oxidation therefore has a width that is greater than the width of the residual trench 26.

The width of the residual trench 26 before the oxidation may lie within the range of 20 nm to 70 nm, for example, and the width or thickness of the dielectric 50 produced by thermal oxidation then lies between 30 nm and 100 nm.

If the semiconductor layer 27B deposited last is a pure silicon layer applied to an SiGe layer 27A, then the semiconductor layer 27B composed of monocrystalline silicon is strained owing to the higher crystal lattice constant of silicon-germanium in comparison with silicon, which brings about, in comparison with unstrained monocrystalline silicon, increased electron mobility and a reduced electrical resistance in the semiconductor layer 27B and thus in the region of the zone of charge carrier accumulation.

Instead of two or three semiconductor layers 83, in the case of the semiconductor component, it is also possible to provide three or more semiconductor layers which are deposited successively onto an arrangement corresponding to FIG. 6E for example conformally and in monocrystalline fashion on the front side.

The method outlined imposes stringent requirements on the tolerance of the trench width and the inclination of the trench sidewalls. These depend in particular on the phototechnology and hard mask technology used for trench production.

For a nominal trench width b0=1 μm, one may assume for example fluctuations of the feature size of ±40 nm from the phototechnology (when using i-line photo technology), and also ±5% of the trench width, i.e. ±50 μm, due to the etching method, thus resulting in a total tolerance of ±90 nm.

In order to avoid this disadvantage, it is proposed—as illustrated in FIG. 9A—to produce at a defined point in time of the deposition of the semiconductor layer 83 in the upper region of the trench 26, in a targeted manner, an overhang having the width d of, for example, 100 nm per trench side, which can be influenced by the choice of deposition conditions, in particular gas flow, gas composition, and temperature during CVD processes. In its lower region, the trench 26 has a width b1 reduced by comparison with the original trench width b0. The consequence of this is that—as can be seen from FIG. 9B—the remaining opening grows over in the upper region of the trench 26, while a cavity 27 is formed below the closure location, the width b2 of the cavity in the lower region of the former trench 26 having a tolerance lying within the range of the layer thickness tolerance of the deposited semiconductor layer 83. Given the orders of magnitude mentioned, such layer thickness tolerances can be kept at less than ±10 nm, which amounts to a significant improvement in comparison with the ±90 nm mentioned above.

Afterward, the arrangement, proceeding from the front side 11, can be planarized and/or etched back in a manner free of masking to an extent such that the remaining trench 26 has a width b2 that is very precisely defined and constant within the scope of the layer thickness tolerance of the semiconductor layer 83.

This narrow trench 26 can then be wholly or partly grown over with one or more further thin layers, as has already been thoroughly explained.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor component comprising:
   a drift zone, arranged between a first component zone and a drain zone;
   a drift control zone arranged adjacent to the drift zone in a first direction; and
   a dielectric layer arranged between the drift zone and the drift control zone, wherein the drift zone has a varying doping and/or a varying material composition at least in sections proceeding from the dielectric,
   wherein the drift zone has at least one first section and a second section adjoining the first section in the first direction, the second section doped with dopant atoms of a type complementary to the first section,
   wherein the drift control zone is coupled to the drain zone through a diode, and
   wherein the diode includes a first diode zone doped complementarily to the drain zone and a second diode zone doped complementarily to the first diode zone.

2. The semiconductor component of claim 1, wherein the doping concentration of the second section is chosen in such a way that it has at least in sections, a higher voltage loading capacity than the first section.

3. The semiconductor component of claim 1, wherein a doping concentration of the second section changes continuously in a direction of the dielectric layer.

4. The semiconductor component of claim 1, wherein the dielectric layer has a thickness of 30 nm to 200 nm.

5. The semiconductor component of claim 1, comprising wherein the first section has a first material composition and the second section has at least a second material composition.

6. The semiconductor component of claim 5, comprising wherein the second section has a first layer composed of $Si_xGe_{1-x}$, where $0.7 < x \leq 1$, and a layer composed of silicon or $Si_yGe_{1-y}$ where $0.7 < y \leq 1$ and $x < y$ which is arranged between the first layer and the dielectric layer.

7. The semiconductor component of claim 5, comprising wherein the second section has a first layer composed of silicon or $Si_xGe_{1-x}$, where $0.7 < x \leq 1$, and layer of $Si_yGe_{1-y}$ where $0.7 < y \leq 1$ and $x > y$, which is arranged between the first layer and the dielectric layer.

8. The semiconductor component of claim 7, comprising wherein the thickness of the second layer in the first direction is between 10 nm and 300 nm.

9. The semiconductor component of claim 7, comprising wherein the dielectric layer has a thickness of 50 nm to 140 nm.

10. The semiconductor component of claim 5, comprising wherein the first section is composed of silicon-germanium.

11. The semiconductor component of claim 1, comprising wherein the first section is composed of silicon and the second section is composed of silicon-germanium.

12. The semiconductor component of claim 11, comprising wherein germanium content in the second section decreases in a direction of the dielectric layer.

13. The semiconductor component of claim 12, comprising wherein the second section has a layer composed of silicon directly adjoining the dielectric layer.

14. The semiconductor component of claim 12, comprising wherein the second section has a layer composed of silicon at a distance from the dielectric layer.

15. A semiconductor component comprising:
   a drift zone, arranged between a first component zone and a second component zone;
   a drift control zone arranged adjacent to the drift zone in a first direction; and
   a dielectric layer arranged between the drift zone and the drift control zone,
   wherein the drift zone has a varying doping and/or a varying material composition at least in sections proceeding from the dielectric,
   wherein the drift zone has at least one first section and a second section adjoining the first section in the first direction, the second section doped with dopant atoms of a type complementary to the first section,
   wherein the doping concentration of the second section is chosen in such a way that it has at least in sections, a higher voltage loading capacity than the first section, and
   wherein a doping concentration of the second section changes continuously in a direction of the dielectric layer until an extremum is reached, wherein the extremum is reached at a distance from the dielectric layer, and changes continuously in a direction of the dielectric layer proceeding from the extremum.

* * * * *